US007436043B2

(12) United States Patent
Sung et al.

(10) Patent No.: US 7,436,043 B2
(45) Date of Patent: Oct. 14, 2008

(54) N-WELL AND N+ BURIED LAYER ISOLATION BY AUTO DOPING TO REDUCE CHIP SIZE

(75) Inventors: Tzu-Chiang Sung, Jhubei (TW); Chih Po Huang, HsinChu (TW); Rann Shyan Yeh, Hsin-Chu (TW); Jun Xiu Liu, Hsinchu (TW); Chi-Hsuen Chang, Hsinchu (TW); Chung-I Chen, Hsinchu (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 129 days.

(21) Appl. No.: 11/019,753

(22) Filed: Dec. 21, 2004

(65) Prior Publication Data

US 2006/0133189 A1   Jun. 22, 2006

(51) Int. Cl.
*H01L 21/74* (2006.01)
(52) U.S. Cl. .............................. 257/500; 257/E27.064
(58) Field of Classification Search ................. 257/500, 257/E27.064
See application file for complete search history.

(56) References Cited

U.S. PATENT DOCUMENTS 5,156,989 A * 10/1992 Williams et al. ............ 438/206

| | | | | |
|---|---|---|---|---|
| 5,786,617 A * | 7/1998 | Merrill et al. | ................ | 257/371 |
| 6,403,992 B1 * | 6/2002 | Wei | ............................ | 257/204 |
| 6,594,132 B1 * | 7/2003 | Avery | ......................... | 361/111 |
| 2003/0122195 A1 * | 7/2003 | Tada et al. | ................... | 257/355 |
| 2005/0056907 A1 * | 3/2005 | Maeda | ........................ | 257/500 |

OTHER PUBLICATIONS

Wolf et al., Silicon Processing for the VLSI Era, 2000, Lattice Press, vol. 2 2nd ed., p. 832.*

* cited by examiner

*Primary Examiner*—Richard T. Elms
*Assistant Examiner*—Michael Lulis
(74) *Attorney, Agent, or Firm*—Duane Morris LLP

(57) ABSTRACT

A semiconductor device includes multiple low voltage N-well (LVNW) areas biased at different potentials and isolated from a substrate by a common N+ buried layer (NBL) and at least one high voltage N-well (HVNW) area. The LVNW areas are coupled to the common, subjacent NBL through a common P+ buried layer (PBL). The method for forming the substrate usable in a semiconductor device includes forming the NBL in a designated low voltage area of a negatively biased P-type semiconductor substrate, forming the PBL in a section of the NBL area by implanting P-type impurity ions such as indium into the PBL, and growing a P-type epitaxial layer over the PBL using conditions that cause the P-type impurity ions to diffuse into the P-type epitaxial layer such that the PBL extends into the NBL. Low-voltage P-well areas are also formed in the P-type epitaxial layer and contact the PBL.

11 Claims, 3 Drawing Sheets

N-WELL AND N+ BURIED LAYER ISOLATION BY AUTO DOPING TO REDUCE CHIP SIZE

FIELD OF THE INVENTION

The present invention relates, most generally, to semiconductor devices and methods for their manufacture. More particularly, the present invention is related to substructures formed in and on a substrate that accommodates integrated circuit devices and methods for forming the same.

BACKGROUND

P-doped material is commonly used as a substrate upon which integrated circuits and other semiconductor devices are formed. The P-type substrate is commonly tied to ground. Particular integrated circuit designs, however, allow for the P-type substrate to be negatively biased. An example of such an integrated circuit design is a TFT-LCD (Thin Film Transistor, Liquid Crystal Display) driver integrated circuit. Various design rule restrictions apply for negatively biased P-type substrates depending on the particular technology used. Examples of such a technology are triple gate technologies that use at least one high voltage and a plurality of low voltages. Low voltage devices with different potentials must be isolated using individual dedicated N+ buried layers (NBL) combined with high voltage N-well (HVNW) areas, that is, low voltage devices with different voltage potentials must not be connected to a common NBL using conventional technology. N+ buried layers are required for high voltage PMOS and isolated high voltage NMOS devices. If LVNW areas of different potentials contact a common NBL, then the subsequent thermal processing utilized in device formation will cause a diffusion of impurities from the common NBL into each of the low voltage N-well areas. In this case, the LVNW areas will be coupled to each other through the NBL preventing the respective low voltage N-well areas from being biased at different potentials. Therefore, using conventional technology, low voltage N-well areas desired to be biased at different potentials must be individually separated from the substrate by an associated NBL in combination with a high voltage N-well (HVNW) area. LVNW areas are conventionally formed over the NBL meaning that a plurality of individually dedicated NBL's would be required to correspond to the superjacent LVNW areas that are to be biased differently. Design rules typically require that adjacent NBL areas include a minimum spacing of about 12 microns or thereabout. Therefore, the approach of forming a corresponding NBL in a substrate for each low voltage N-well area to accommodate the low voltage N-well areas being biased differently, is not favored because the formation of so many NBL areas would necessarily and significantly enlarge chip size undesirably.

It would therefore be advantageous to form a plurality of low voltage N-well areas that can be bias at different potentials, over a common NBL.

SUMMARY OF THE INVENTION

To address these and other needs and in view of its purposes, provided is a semiconductor device comprising a plurality of low voltage N-well (LVNW) areas biased at different potential levels and subjacently separated from a semiconductor substrate by a common N+ buried layer (NBL). The NBL may be formed in a designated low voltage area of a P-doped substrate.

Also provided is a semiconductor device comprising a plurality of low voltage N-well (LVNW) areas biased at different potential levels and formed over a common N+ buried layer (NBL) with a common P+ buried layer (PBL) disposed between the plurality of LVNW areas and the NBL.

Also provided is a method for forming a substrate usable in a semiconductor device. The method includes forming an N+ buried layer (NBL) in a designated low voltage area of a P-type semiconductor substrate, forming a P+ buried layer (PBL) in a PBL section of the NBL area by implanting P-type impurity ions into the PBL section, growing a P-type epitaxial layer over the PBL using conditions that cause the P-type impurity ions to diffuse from the PBL into the P-type epitaxial layer such that the PBL extends into the NBL. The method further includes forming a plurality of low-voltage P-well (LVPW) areas in the P-type epitaxial layer. The LVPW areas contact the PBL.

BRIEF DESCRIPTION OF THE DRAWING

The present invention is best understood from the following detailed description when read in conjunction of the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

One aspect of the invention provides a substructure upon and within which various semiconductor devices may be formed, and a method for forming the substructure. The substructure is formed of a semiconductor substrate and includes variously doped and variously biased regions that accommodate the formation of associated components and devices that may combine to form integrated circuits or other semiconductor devices according to various technologies and designs. Such technologies include technologies in which a negatively biased P-doped material is used as a substrate for an integrated circuit. An example of such a technology may be a 0.18/0.25 micron triple gate high voltage technology such as used for TFT-LCD driver integrated circuits.

Figure 1:
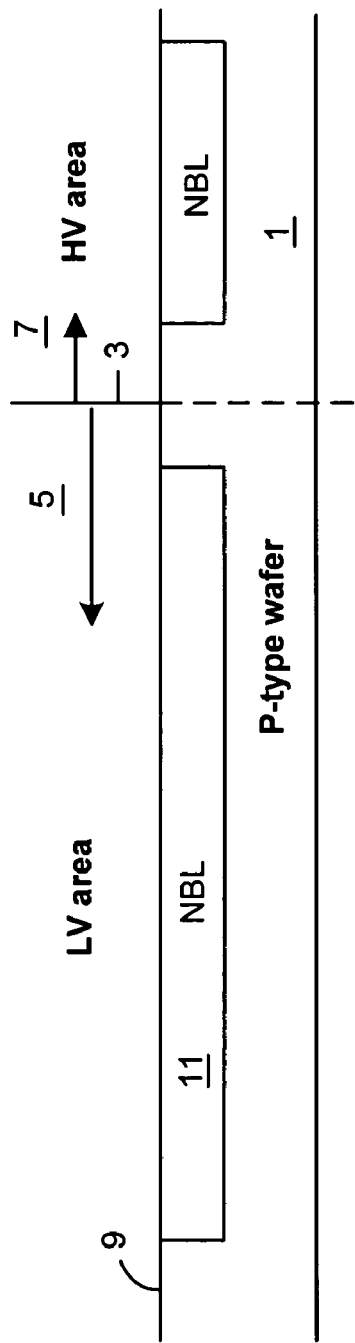
FIGS. 1-5 are each cross-sectional views and together depict a process sequence for forming an exemplary substrate structure according to the present invention.

FIG. 1 is a cross-sectional view showing substrate 1 which may be formed of silicon or other suitable semiconductor materials. Arbitrary dividing line 3 divides the area designated to be low voltage area 5, from the area designed to be high voltage area 7. Substrate 1 may be a P-type wafer typically used in the semiconductor manufacturing industry and surface 9 may be polished. Various conventionally used P-type dopants may be used to provide the P-type characteristics to substrate 1. Substrate 1 may be biased negatively using conventional techniques and may be formed of a semiconductor material such as silicon. Within each of low voltage area 5 and high voltage area 7 there is an NBL-N+ buried layer, formed within substrate 1 and having a top surface coplanar with surface 9 of substrate 1. NBL 11 is preferably formed of an N-type dopant that is a heavy atom and resistant to diffusion during subsequent high temperature processes. In one embodiment, antimony, Sb, may be used as the N-type dopant impurity. Conventional masking techniques in conjunction with ion implantation or other techniques may be used to introduce the N-type dopant impurity into substrate 1 to form NBL 11 and conventional thermal drive-in techniques may be used after the dopant impurity in introduced. Using conventional terminology, an N+ or P+ region such as NBL 11 denotes a highly doped region of N or P-type dopant impurities, typically having a dopant impurity concentration of greater than about $1e^{14}$ to $1e^{15}$ atoms/cm2. After the NBL drive-in process, a further surface implant may be used to prevent adjacent NBL layers from punch through and to increase high voltage breakdown voltage since the P-type epitaxial layer that will be later formed, will be a relatively lightly doped layer.

Figure 2:
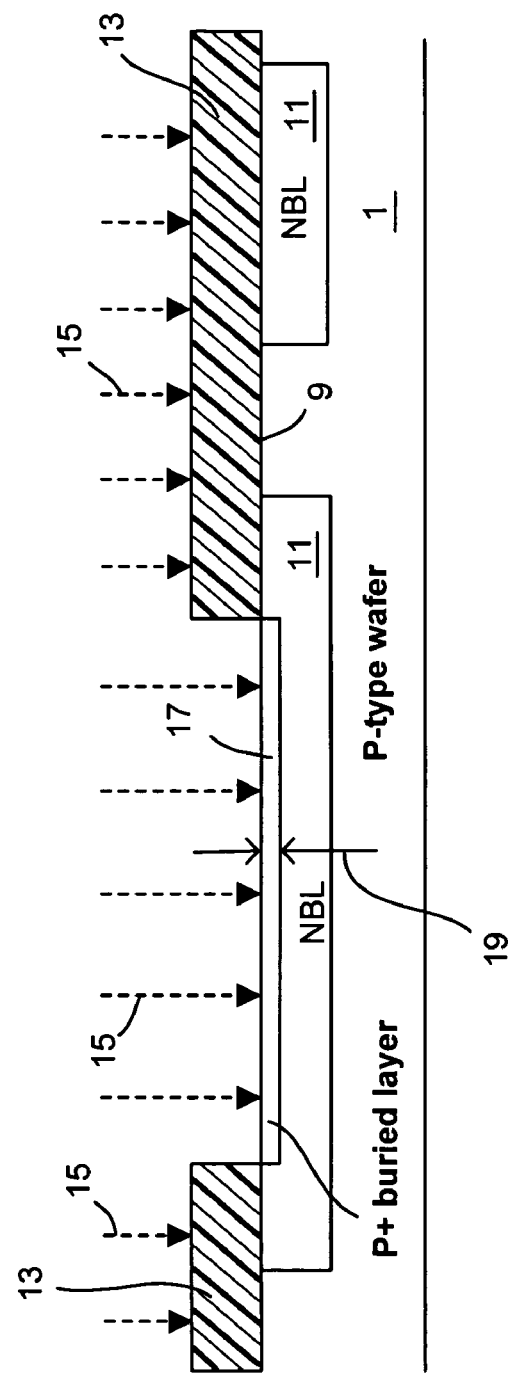

FIG. 2 shows the formation of P+ buried layer, or PBL 17. Photoresist pattern 13 is first formed over the structure shown in FIG. 1 then an ion implantation process designated by arrows 15, is used to introduce dopant impurities into the unmasked portion of NBL 11 to form P+ buried layer or PBL 17. In an exemplary embodiment, indium may be used as the dopant impurity to form PBL 11. Because indium is a relatively heavy atom, surface 9 may be damaged by the implant process and a rapid thermal anneal process may be used to recover substrate surface damage. In one embodiment, the rapid thermal anneal may take place at 1050° C. for 155 seconds but in other exemplary embodiments, other conditions may be used. The rapid thermal anneal may include a temperature within the range of 1000° C. to 1100° C. for a time within the range of 100 seconds to 200 seconds in other exemplary embodiments. As formed, PBL 17 includes thickness 19 which may increase during subsequent processing operations as will be shown in FIG. 3. After photoresist pattern 13 is removed and the structure advantageously cleaned, a P-type epitaxial layer is formed over the structure of FIG. 2, using conventional techniques.

Figure 3:
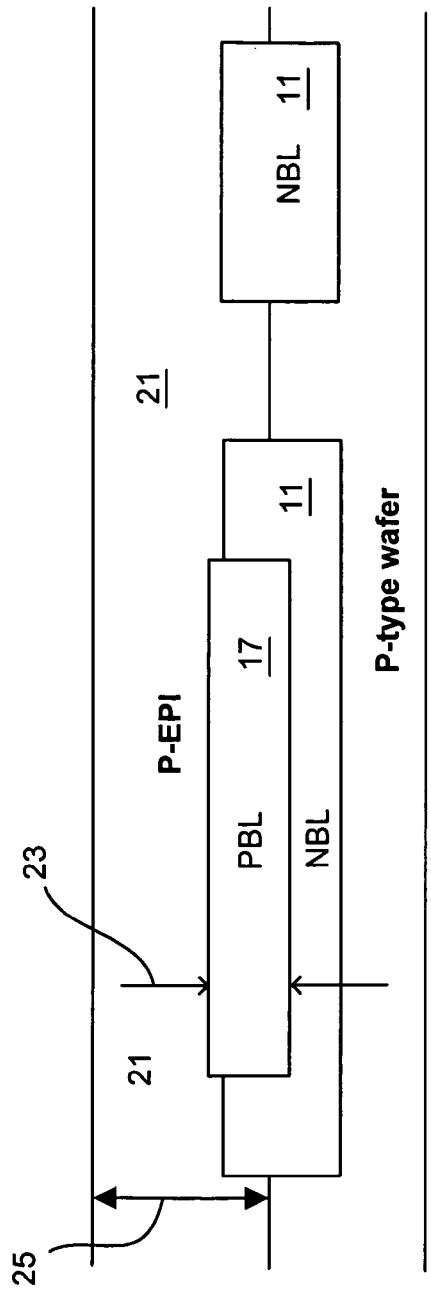

P-type epitaxial layer 21 is shown in FIG. 3. In an exemplary embodiment, the epitaxial deposition temperature may be 1200° C. but may range from 1050° C. to 1350° C. in other exemplary embodiments. P-type epitaxial layer 21 may include a thickness 25 of 4.5 microns and a resistivity of 45 ohm-centimeters in one exemplary embodiment, but other thicknesses may be used in other exemplary embodiments. In other exemplary embodiments, thickness 25 may range from 4 to 5 microns and P-type epitaxial layer 21 may include a resistivity within the range of 40 to 50 ohm-centimeters. The high temperature expitaxy process also urges the indium, previously implanted to form PBL layer 17, to diffuse into P-type epitaxial layer 21, NBL 11, or both, increasing the thickness of PBL layer 17 to increased thickness 23 shown in FIG. 3. Thickness 23 may range from 2 um to 3 um in various exemplary embodiments.

Figure 4:
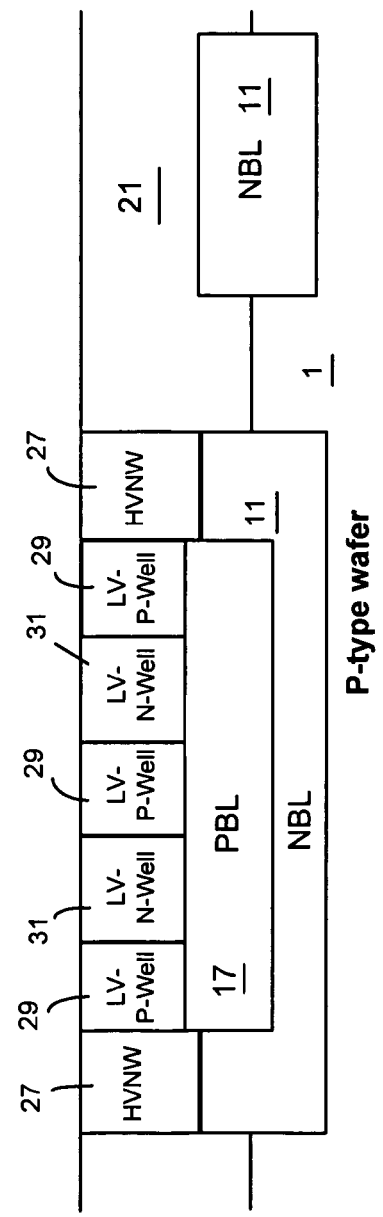

Now turning to FIG. 4, a plurality of differently doped regions are now formed within P-type epitaxial layer 21 using conventional methods. Low voltage N-well (LVNW) regions 31 are formed within P-type epitaxial layer 21 using conventional patterning and retrograde well formation techniques. Interposed between adjacent LVNW's 31 are low voltage P-well (LVPW) regions 29 which may be also formed using conventional patterning and retrograde formation techniques. Conventional N-type dopants such as phosphorus and P-type dopants such as boron may be used. The LVPW's and LVNW's may each be retrograde wells. Low voltage N-well (LVNW) regions 31 and low voltage P-well (LVPW) regions 29 are subjacently separated from substrate 1 by common N+ buried layer (NBL) 11 and laterally separated from substrate 1 by at least one high voltage N-well (HVNW) region 27. HVNW regions 27 are also formed using conventional patterning, ion implantation and drive-in techniques. It can be seen that high voltage N-well regions 27 surround PBL 17 and therefore the low voltage P-well regions 29 and low voltage N-well regions 31 formed over common PBL 17. In one embodiment, a plurality of separate high voltage N-well regions 27 may be used and in another exemplary embodiment, one high voltage N-well region 27 may laterally surround PBL 17 and therefore the low voltage P-well regions 29 and lower voltage N-well regions 31 formed over PBL 17. The illustration of FIG. 4 represents either or both of these exemplary embodiments. Low voltage P-well regions 29 and low voltage N-well regions 31 each contact PBL 17 which contacts NBL 11.

Figure 5:
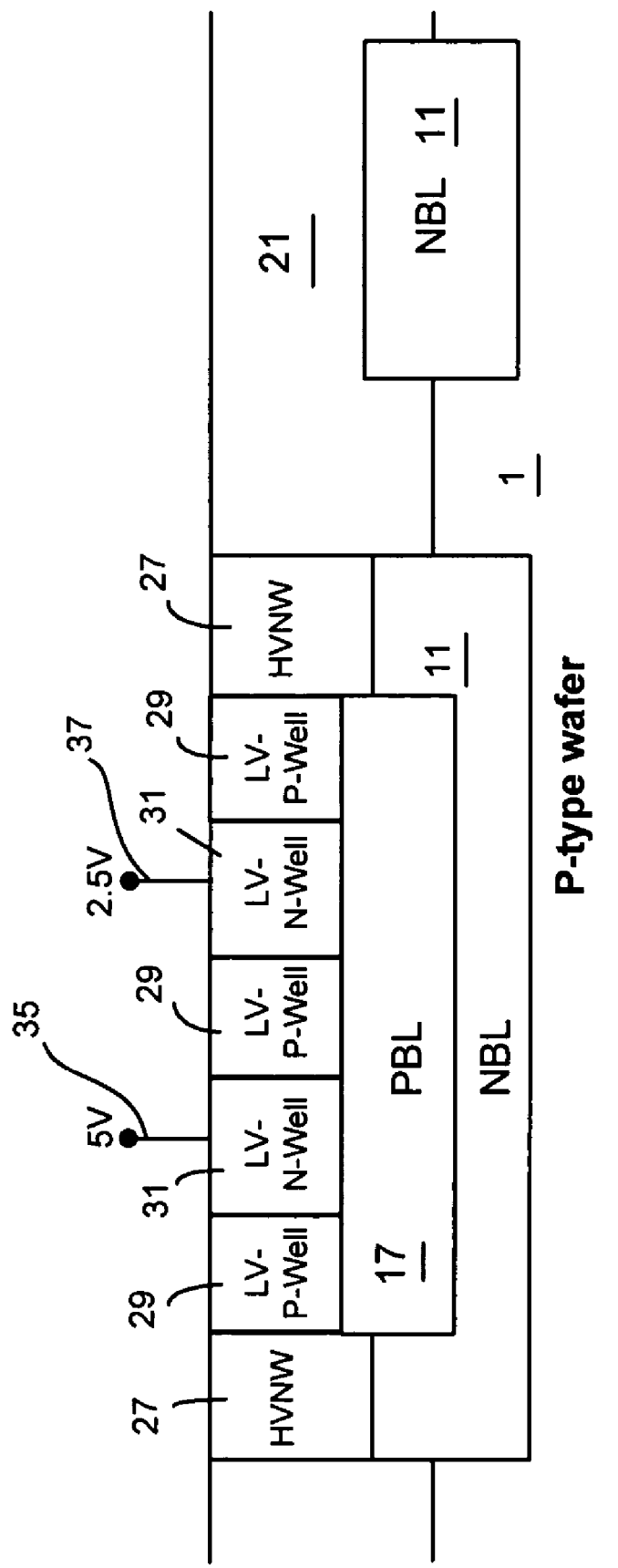

FIGS. 4 and 5 show a plurality of low voltage N-well regions 31 coupled to a common N+ buried layer 11 through a common P+ buried layer 17. The different low voltage N-well regions 31 may be maintained at different biases. For example, the low voltage N-well region 31 on the left hand side of FIG. 5 may be biased at 5 volts by way of electrical connection 35 and the low voltage N-well region 31 on the right hand side of FIG. 5 may be biased at a potential of 2.5 volts using electrical connection 37. Electrical connections 35 and 37 represent conventional means for contacting the respective LVNW regions 31 and for biasing the respective low voltage N-well regions 31. In other exemplary embodiments, other potential levels may be used. It is an aspect of the invention that LVNW regions 31 are separated from substrate 1 by a common NBL 11 together with one or more HVNW regions 27. LVNW regions 31 contact a common P+ buried layer 17 which is joined to the same NBL 11. LVNW regions 31 may be maintained at different biases because P+ buried layer 17 prevents the electrical shorting between respective LVNW regions 31 due to diffusion from N+ buried layer 11 during thermal processes that take place at elevated temperatures. Chip size reduction is achieved because the LVNW regions 31 to be held at different potentials do not require an associated N+ buried layer 11. The multiple low voltage N-well regions 31 and devices formed in this region use the common NBL 11, together with high voltage N-well (HVNW) regions 27 to maintain a separate bias from substrate 1, when a negative bias is applied to the substrate 1.

In another aspect, the present invention provides a method for forming a substrate usable in a semiconductor device. The method comprises forming an N+ buried layer (NBL) in a designated low voltage area of a P-type semiconductor substrate, forming a P+ buried layer (PBL) in a PBL section of the NBL by implanting P-type impurity ions into the PBL section, growing a P-type epitaxial layer over the PBL using conditions that cause the P-type impurity ions to diffuse from the PBL into the P-type epitaxial layer such that the PBL extends into the NBL, and forming a plurality of low voltage P-well (LVPW) areas that contact the PBL in the P-type epitaxial layer. The N+ buried layer may be formed by ion implantation followed by a thermal treatment that drives in the ions. The NBL may include Sb as a dopant impurity therein. The P-type impurity ions may be indium. The P+ buried layer formation may further comprise, after the implanting, rapid thermal annealing at a temperature within a range of 1000° C. to 1100° C. for a time within a range of 100 seconds to 200 seconds. The method may further comprise forming a plurality of low voltage N-well (LVNW) areas that contact the PBL, in the P-type epitaxial layer and interposed between adjacent LVPW areas. The plurality of LVPW areas may be formed by patterning and implanting P-type ions and forming the plurality of LVNW areas may comprise patterning and implanting N-type ions. The conditions that cause the P-type impurity ions to diffuse from the PBL into the P-type epitaxial layer may include a temperature of about 1050-1350° C. The method may include growing the P-type epitaxial layer to a thickness ranging from 4 to 5 microns and to include a resistance within a range of 40 to 50 ohm-centimeters. The method may further comprise forming at least one high voltage N-well (HVNW) area that contacts the PBL, in the P-type epitaxial layer. In one embodiment, the NBL subjacently separates the plurality of LVPW areas from the semiconductor substrate and the at least one HVNW area laterally separates the plurality of LVPW areas from the semiconductor substrate. The method may further include biasing a first LVPW of the plurality of LVPW areas at a first potential and a second LVPW area of the plurality of LVPW areas at a second voltage being greater than the first potential. In one embodiment, the first potential is about 2.5 volts and the second potential is about 5 volts. The method may further comprise applying a negative bias to the semiconductor substrate.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical,", "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A semiconductor device comprising a plurality of low voltage N-well (LVNW) areas, a plurality of low voltage P-well (LVPW) areas interposed between said LVNW areas and said LVNW and LVPW areas subjacently separated from a semiconductor substrate by a common $N^+$ buried layer (NBL), a common $P^+$ buried layer (PBL) formed directly beneath said plurality of LVNW areas and said plurality of LVPW areas and above said NBL such that each of said plurality of LVNW areas and each of said plurality of LVPW areas physically contacts said PBL, said plurality of LVNW areas and said plurality of LVPW areas laterally separated from said semiconductor substrate by a high voltage N-well (HVNW) area that surrounds said PBL.

2. The semiconductor device as in claim 1, wherein said semiconductor substrate comprises a P-type silicon substrate.

3. The semiconductor device as in claim 2, wherein said semiconductor substrate includes a negative voltage potential.

4. The semiconductor device as in claim 1, wherein said PBL comprises indium as a dopant impurity therein.

5. The semiconductor device as in claim 1, wherein said NBL is a first layer formed within said semiconductor substrate, said PBL is a second layer formed over said NBL and said LVNW areas and said LVPW areas are formed in a third layer formed over said PBL.

6. The semiconductor device as in claim 5, wherein said third layer includes a surface contactable by at least one voltage source.

7. The semiconductor device as in claim 1. wherein said NBL is disposed in a designated low voltage area of said semiconductor substrate.

8. The semiconductor device as in claim 1, wherein said plurality of LVNW areas are biased at different potentials.

9. The semiconductor device as in claim 1, wherein said NBL comprises Sb as a dopant impurity therein.

10. The semiconductor device as in claim 1, wherein said plurality of low voltage N-well (LVNW) areas and said plurality of low voltage P-well (LVPW) areas are disposed in an epitaxial layer of P-type material disposed over said semiconductor substrate.

11. A semiconductor device comprising a plurality of low voltage N-well (LVNW) areas and a plurality of low voltage P-well (LVPW) areas disposed in an epitaxial layer of P-type material disposed over a semiconductor substrate,
    said LVPW areas interposed directly between said LVNW areas,
    said LVNW and LVPW areas subjacently separated from said semiconductor substrate by a common $N^+$ buried layer (NBL),
    a common $P^+$ buried layer (PBL) formed directly beneath said plurality of LVNW areas and said plurality of LVPW areas and above said NBL such that each of said plurality of LVNW areas and each of said plurality of LVPW areas physically contacts said PBL,
    said plurality of LVNW areas and said plurality of LVPW areas laterally separated from said semiconductor substrate by a high voltage N-well (HVNW) area that surrounds said PBL.

* * * * *